United States Patent
Gao et al.

(10) Patent No.: US 9,356,612 B2
(45) Date of Patent: May 31, 2016

(54) METHOD AND APPARATUS TO CALIBRATE FREQUENCY SYNTHESIZER

(71) Applicant: MARVELL WORLD TRADE LTD, St. Michael (BB)

(72) Inventors: Xiang Gao, Fremont, CA (US); Li Lin, Saratoga, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 14/540,485

(22) Filed: Nov. 13, 2014

(65) Prior Publication Data

US 2015/0130544 A1    May 14, 2015

Related U.S. Application Data

(60) Provisional application No. 61/904,289, filed on Nov. 14, 2013.

(51) Int. Cl.

| | | |
|---|---|---|
| *H03L 7/085* | (2006.01) | |
| *H03L 7/197* | (2006.01) | |
| *H03L 7/18* | (2006.01) | |
| *H03L 7/099* | (2006.01) | |
| *H03L 7/091* | (2006.01) | |
| *H03L 7/183* | (2006.01) | |

(52) U.S. Cl.
CPC .......... *H03L 7/18* (2013.01); *H03L 7/085* (2013.01); *H03L 7/091* (2013.01); *H03L 7/099* (2013.01); *H03L 7/0992* (2013.01); *H03L 7/183* (2013.01); *H03L 7/197* (2013.01)

(58) Field of Classification Search
CPC ............. H03L 7/06; H03L 7/08; H03L 7/085; H03L 7/0991; H03L 7/0992; H03L 7/18; H03L 7/183; H03L 7/197
USPC ........ 327/147, 150, 156, 159; 331/10, 16–18, 331/36 C; 375/373, 376
See application file for complete search history.

(56) References Cited

U.S. PATENT DOCUMENTS

| | | | | |
|---|---|---|---|---|
| 6,545,547 B2 * | 4/2003 | Fridi | ....................... | H03L 7/099 331/16 |
| 7,804,367 B2 * | 9/2010 | Lee | ..................... | H03L 7/087 327/156 |
| 7,940,129 B1 * | 5/2011 | Tsang | ....................... | H03L 1/02 331/17 |
| 8,421,542 B2 * | 4/2013 | Romano | ................. | H03L 7/099 327/156 |
| 8,686,771 B2 * | 4/2014 | Frantzeskakis | ........... | H03L 7/10 327/150 |
| 2003/0016088 A1 * | 1/2003 | Scheffler | ................ | H03L 7/099 331/100 |
| 2005/0057289 A1 | 3/2005 | Pham | | |

(Continued)

OTHER PUBLICATIONS

International Search Report and Written Opinion issued on Feb. 10, 2015 in PCT/US2014/065433.

*Primary Examiner* — Levi Gannon

(57) ABSTRACT

Aspects of the disclosure provide a circuit that includes a detector, a loop filter and a controller. The detector is configured to generate a first signal indicative a timing difference between a reference clock signal and a feedback clock signal. The feedback clock signal is generated based on an oscillating signal from an oscillator. The oscillator includes a first tuning circuit and a second tuning circuit to tune a frequency of the oscillating signal. The loop filter is configured to filter out a portion of frequency components from the first signal to generate a second signal for tuning the first tuning circuit of the oscillator. The controller is configured to tune the second tuning circuit based on the first signal and the second signal.

20 Claims, 3 Drawing Sheets

(56) References Cited

U.S. PATENT DOCUMENTS

| | | | |
|---|---|---|---|
| 2006/0208808 A1* | 9/2006 | Bang | H03L 7/10 331/16 |
| 2008/0220733 A1* | 9/2008 | McCune | H03L 7/099 455/118 |
| 2008/0266004 A1* | 10/2008 | Denier | H01L 41/042 331/1 A |
| 2010/0013531 A1 | 1/2010 | Ainspan et al. | |
| 2012/0249195 A1* | 10/2012 | Guo | H03L 7/103 327/156 |
| 2013/0222024 A1* | 8/2013 | Chen | H03L 7/093 327/157 |
| 2013/0278303 A1* | 10/2013 | Chen | H03L 7/101 327/117 |
| 2014/0340161 A1* | 11/2014 | Canard | H03L 7/0992 331/16 |

* cited by examiner

METHOD AND APPARATUS TO CALIBRATE FREQUENCY SYNTHESIZER

INCORPORATION BY REFERENCE

This present disclosure claims the benefit of U.S. Provisional Application No. 61/904,289, "A Fast Frequency Calibration Schemes for Digital Frequency Synthesizer" filed on Nov. 14, 2013, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Various circuits, such as wireless transceivers, data converters, wireline and optical serial data communication links, processors, and the like, operate based on a periodic clock signal. Generally, the periodic clock signal is generated by a frequency synthesizer. The frequency synthesizer can be tuned to output the periodic clock signal of a desired frequency.

SUMMARY

Aspects of the disclosure provide a circuit that includes a detector, a loop filter and a controller. The detector is configured to generate a first signal indicative a timing difference between a reference clock signal and a feedback clock signal. The feedback clock signal is generated based on an oscillating signal from an oscillator. The oscillator includes a first tuning circuit and a second tuning circuit to tune a frequency of the oscillating signal. The loop filter is configured to filter out a portion of frequency components from the first signal to generate a second signal for tuning the first tuning circuit of the oscillator. The controller is configured to tune the second tuning circuit based on the first signal and the second signal.

In an embodiment, the controller is configured to detect whether the first signal satisfies a requirement, and tune the second tuning circuit based on the detection. In an example, the controller is configured to compare the first signal to an upper boundary and a lower boundary of a range to detect whether the first signal is in the range, and tune the second tuning circuit based on the comparisons.

According to an aspect of the disclosure, the second tuning circuit is a capacitor bank, and the controller is configured to determine a plurality of control bits for configuring the capacitor bank.

In an embodiment, the detector is a time to digital converter configured to generate a first digital signal indicative the timing difference between the reference clock signal and the feedback clock signal, and the loop filter is a digital loop filter configured to filter out high frequency components from the first digital signal to generate a second digital signal to tune the first tuning circuit of the oscillator.

Further, in an example, the circuit includes a frequency divider configured to frequency-divide the oscillating signal to generate the feedback clock signal, and includes a sigma-delta modulator configured to dither a divisor of the frequency divider. The controller is configured to control the sigma-delta modulator to dither the divisor based on at least one of the first signal and the second signal.

In an embodiment, the controller also adjusts a settling time to allow the oscillator to settle based on the tuning of the second tuning circuit.

Aspects of the disclosure provide a method for calibrating a frequency synthesizer. The method includes receiving a first signal indicative a timing difference between a reference clock signal and a feedback clock signal generated based on an oscillating signal from an oscillator, and receiving a second signal from a filter that filters out a portion of frequency components from the first signal. The second signal is used for tuning a first tuning circuit of the oscillator. The method further includes tuning a second tuning circuit of the oscillator based on the first signal.

Aspects of the disclosure provide an apparatus that includes a controller and a phase-locked loop formed by an oscillator, a frequency divider, a detector, and a loop filter. The oscillator includes a first tuning circuit and a second tuning circuit to tune a frequency of an oscillating signal generated by the oscillator. The frequency divider is configured to frequency divide the oscillator signal to generate a feedback clock signal. The detector is configured to generate a first signal indicative a timing difference between a reference clock signal and the feedback clock signal. The loop filter is configured to filter out a portion of frequency components from the first signal to generate a second signal for tuning the first tuning circuit of the oscillator. The controller is configured to tune the second tuning circuit based on the first signal.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
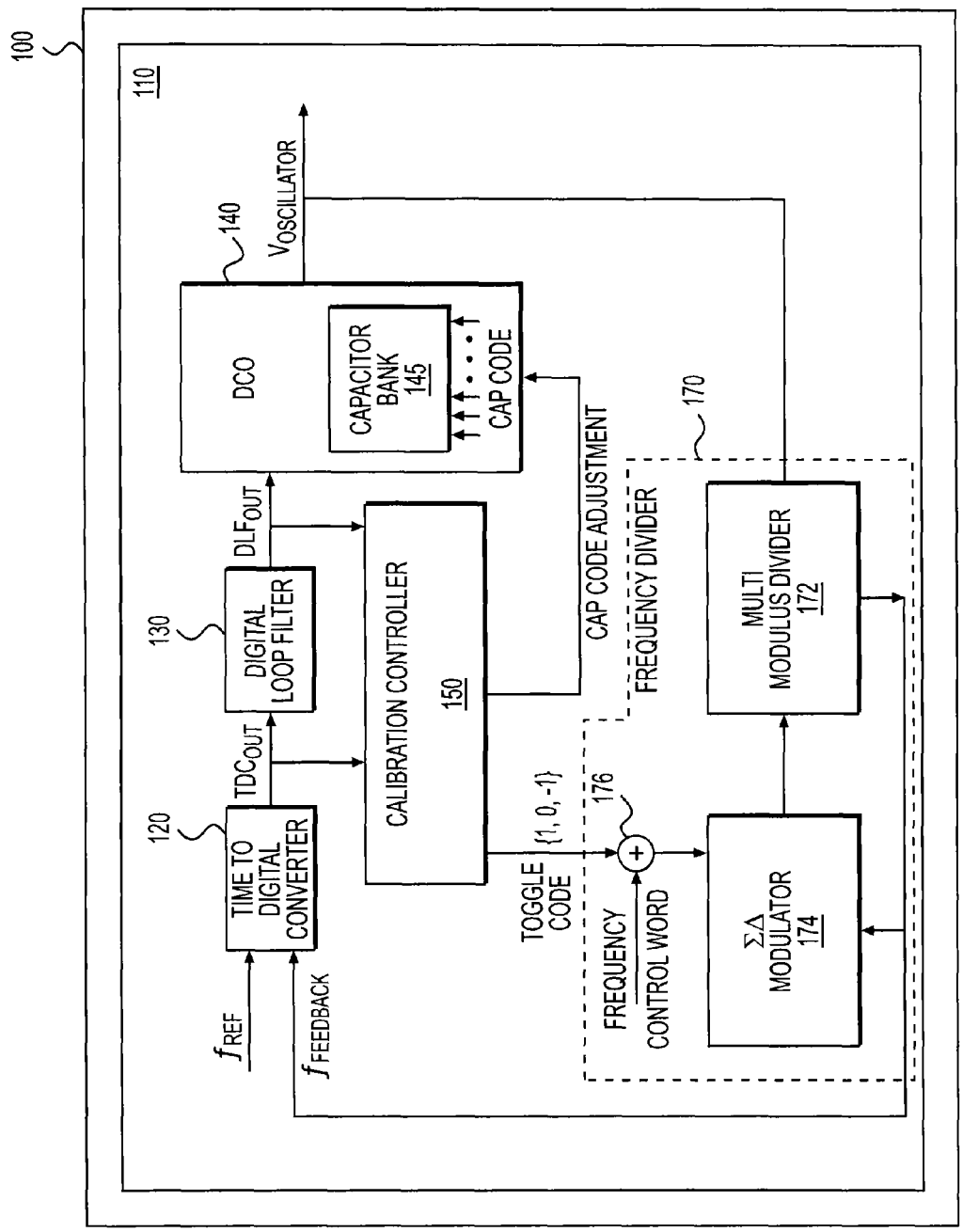
FIG. 1 shows a block diagram of an electronic system example 100 according to an embodiment of the disclosure.

FIG. 1 shows a block diagram of an electronic system example 100 according to an embodiment of the disclosure. The electronic system 100 includes a frequency synthesizer 110 configured to generate an oscillating signal $V_{OSCILLATOR}$ having a frequency of interest. The oscillating signal having the frequency of interest is used by other components of the electronic system 100, such as a transceiver (not shown), a data converter (not shown), a processor (not shown), and the like. The frequency synthesizer 110 includes an oscillator 140 with a capacitor bank 145, and a calibration controller 150. The calibration controller 150 is configured to perform a fast calibration of the oscillator 140 to determine a cap code for the capacitor bank 145 in order to generate the oscillating signal $V_{OSCILLATOR}$ having the frequency of interest in a short time.

The electronic system 100 can be any suitable electronic system that uses a frequency synthesizer to provide an oscillating signal, such as a desktop computer, a laptop computer, a tablet computer, a smart phone, a modem, a network switch, an optical data transmission device, and the like.

In the FIG. 1 example, the frequency synthesizer 110 is a digital frequency synthesizer that uses digital signal processing techniques to form a digital phase-locked loop (DPLL) to lock the oscillating signal at the frequency of interest with reference to a reference clock signal $f_{REF}$. Specifically, the digital phase-locked loop includes a time-to-digital converter (TDC) 120, a digital loop filter (DLF) 130, the oscillator 140, and a frequency divider 170. These elements are coupled together as shown in FIG. 1.

The frequency divider 170 is configured to frequency-divide the oscillating signal $V_{OSCILLATOR}$ to generate a feedback clock signal $f_{FEEDBACK}$. In the FIG. 1 example, the frequency divider 170 is implemented using a multi-modulus fractional N divider architecture. Specifically, the frequency divider 170 includes a multi-modulus divider 172 and a sigma-delta modulator 174. The multi-modulus divider 172 has multiple integer moduli. The sigma-delta module 174 receives a frequency control word indicative a divisor for frequency division. The divisor has an integral part and a fractional part. The sigma-delta module 174 is configured to emulate the fractional part of the frequency divider 170 into instantaneous integral levels, and to control the multi-modulus divider 172 to change modulus. In an example, the frequency control word is suitably provided according to the ratio of the frequency of interest to the frequency of the reference clock signal $f_{REF}$.

The TDC 120 is configured to receive the reference clock signal $f_{REF}$ and the feedback clock signal $f_{FEEDBACK}$, detect a timing difference, such as a phase difference, a frequency difference, and the like between the reference clock signal $f_{REF}$ and the feedback clock signal $f_{FEEDBACK}$, and generate a first digital signal $TDC_{OUT}$ indicative of the timing difference. In an embodiment, the TDC 120 has a capture range, such as a phase error capture range. When a phase error between the reference clock signal $f_{REF}$ and the feedback clock signal $f_{FEEDBACK}$ is in the phase error capture range, the value of the first digital signal $TDC_{OUT}$ is indicative of the phase error, and the DPLL operates to lock the feedback clock signal $f_{FEEDBACK}$ to the reference clock signal $f_{REF}$. When the phase error is out of the phase error capture range, the first digital signal $TDC_{OUT}$ is clipped, and is not indicative of the phase error any more. In an example, when the first digital signal $TDC_{OUT}$ is clipped, it takes a relatively long time for the DPLL to pull the first digital signal $TDC_{OUT}$ back into the phase error capture range.

The DLF 130 receives the first digital signal $TDC_{OUT}$, filters out certain frequency components to generate a second digital signal $DLF_{OUT}$. In an embodiment, the DLF 130 is a low pass filter configured to filter out high frequency components, thus the second digital signal $DLF_{OUT}$ is relatively stable.

The oscillator 140 receives the second digital signal $DLF_{OUT}$ and generates the oscillating signal $V_{OSCILLATOR}$ based on the second digital signal $DLF_{OUT}$. When the feedback clock signal $f_{FEEDBACK}$ is locked to the reference clock signal $f_{REF}$, the oscillating signal $V_{OSCILLATOR}$ has the frequency of interest.

In the FIG. 1 example, the oscillator 140 is a digital controlled oscillator (DCO). In an embodiment, the oscillator 140 includes multiple frequency tuning circuit components to tune the frequency of the oscillating signal $V_{OSCILLATOR}$. In an example, the DCO includes a coarse tuning module, such as the capacitor bank 145, and a fine tuning module, such as one or more varactors (not shown), and the like. The coarse tuning module and the fine tuning module are collectively tuned to adjust the frequency of the oscillating signal $V_{OSCILLATOR}$ and cause the feedback clock signal $f_{FEEDBACK}$ to be locked to the reference clock signal $f_{REF}$.

Generally, the coarse tuning module is calibrated first to reduce the phase error between the feedback clock signal $f_{FEEDBACK}$ and reference clock signal $f_{REF}$, such that the phase error is in a range that can be corrected by tuning the fine tuning module. In an example, the oscillator 140 is configured to have a wide frequency tuning range, such that the frequency synthesizer 110 can be used to generate the oscillating signal with a wide frequency range in order to cover multiple frequency bands. For example, the cap code includes a large number of bits, such as 10 bits, and the like, thus a load capacitance of the oscillator 140 can be tuned in a large capacitance range. The large number of bits can require a relatively long calibration time. In the FIG. 1 example, the calibration controller 150 is configured to perform a fast calibration of the capacitor bank 145 to determine the cap code in a short time. Then the fine tuning module is tuned based on the second digital signal $DLF_{OUT}$ to lock the oscillating signal $V_{OSCILLATOR}$ with reference to the reference clock signal $f_{REF}$.

Specifically, in an embodiment, the calibration controller 150 receives both the first digital signal $TDC_{OUT}$ and the second digital signal $DLF_{OUT}$, and adjusts the cap code based on both the first digital signal $TDC_{OUT}$ and the second digital signal $DLF_{OUT}$. In an example, the calibration controller 150 is configured to detect whether the first digital signal $TDC_{OUT}$ satisfies a requirement, such as in a range, and determine a cap code adjustment based on the detection. For example, when the first digital signal $TDC_{OUT}$ is above an upper limit of the range, the calibration controller 150 is configured to adjust the cap code in a direction, such as to reduce the load capacitance, in order to reduce the first digital signal $TDC_{OUT}$; and when the first digital signal $TDC_{OUT}$ is below a lower limit of the range, the calibration controller 150 is configured to adjust the cap code in a direction, such as to increase the load capacitance, in order to increase the first digital signal $TDC_{OUT}$. When the first digital signal $TDC_{OUT}$ is within the range, the calibration controller 150 further determines the cap code adjustment based on the second digital signal $DLF_{OUT}$. In the embodiment, the calibration controller 150 makes the cap code adjustment based on the first digital signal $TDC_{OUT}$ to avoid clipping the first digital signal $TDC_{OUT}$.

Further, according to an aspect of the disclosure, the calibration controller 150 also provides a toggle code to control the sigma-delta modulator 174 based on at least one of the first digital signal $TDC_{OUT}$ and the second digital signal $DLF_{OUT}$. In the FIG. 1 example, the frequency divider 170 includes an adder 176 configured to combine the frequency control word with the toggle code to generate toggled frequency control word. The sigma-delta modulator 174 then controls the change of the modulus in the multi-modulus divider 170 according to the toggled frequency control word. In an embodiment, the calibration controller 150 generates the toggle code to avoid clipping the first digital signal $TDC_{OUT}$. In an example, the toggle code is used to temporally adjust the phase of the feedback clock signal $f_{FEEDBACK}$ to pull the phase error between the feedback clock signal $f_{FEEDBACK}$ and reference clock signal $f_{REF}$ in the phase error capture range, thus the first digital signal $TDC_{OUT}$ is not clipped.

According to an aspect of the disclosure, when the first digital signal $TDC_{OUT}$ is clipped, it takes a relatively long time to pull the first digital signal $TDC_{OUT}$ back to the phase error capture range. When signal clipping is avoided, the calibration time is saved.

According to another aspect of the disclosure, the calibration controller 150 is configured to dynamically adjust a wait time for settling. In an embodiment, the digital circuits in the DPLL operate based on a clock signal, such as a system clock, the reference clock signal, and the like. The calibration controller 150 initializes a relatively small number of clock cycles, such as 4 cycles and the like, as the wait time at the beginning of the calibration when the phase error is large; and gradually increases the wait time to allow enough time for the DPLL to settle. The dynamic wait time adjustment saves the total calibration time.

In an implementation of the electronic system 100, the capacitor bank 145 uses 10-bit cap code. The cap code search time for 100,000 random frequency tests are measured, the minimum search time is 0.5 μs, the average search time is 5.1 μs, and the maximum search time is 22 μs. In a related example, each bit requires 35 μs search time, and the total search time is 350 μs. The search time of the implementation is much smaller than the related example.

It is noted that the calibration controller 150 can be implemented using various techniques. In an example, the calibration controller 150 is implemented using circuits. In another example, the calibration controller 150 is implemented as a processor executing code instructions.

Figure 2:
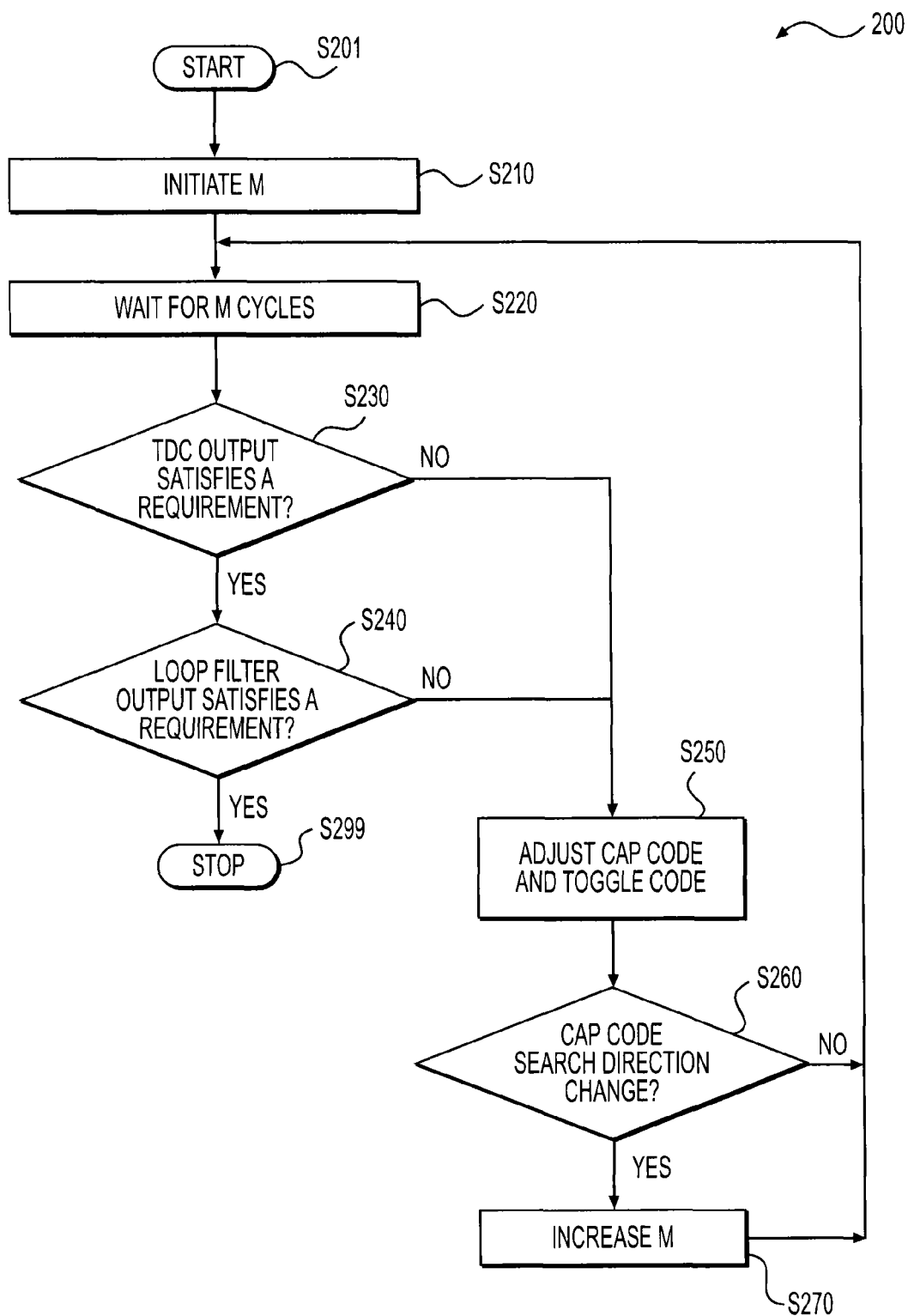
FIG. 2 shows a flow chart outlining a process example 200 according to an embodiment of the disclosure.

FIG. 2 shows a flow chart outlining a process example 200 according to an embodiment of the disclosure. In an example, the process is executed by a controller, such as the calibration controller 150 in the frequency synthesizer 110 to determine the cap code for configuring the capacitor bank 145. The process starts at S201, and proceeds to S210.

At S210, a wait time (e.g., M clock cycles) for an oscillator to settle is initialized. In the FIG. 1 example, at the beginning of the calibration, the calibration controller 150 initializes a relatively small number of wait cycles, such as four clock cycles of the system clock, as the wait time.

At S220, the controller waits according to the wait time. In the FIG. 1 example, the calibration controller 150 waits according to the number of wait cycles for the DPLL to settle.

At S230, the controller determines whether a detector output satisfies a requirement. In the FIG. 1 example, the calibration controller 150 receives the first digital signal $TDC_{OUT}$ output from the TDC 120, and determines whether the first digital signal $TDC_{OUT}$ is in a TDC range. In an example, the TDC range is predefined to avoid clipping the first digital signal $TDC_{OUT}$. When the first digital signal $TDC_{OUT}$ is in the TDC range, the process proceeds to S240; otherwise, the process proceeds to S250.

At S240, the controller determines whether a loop filter output satisfies a requirement. In the FIG. 1 example, the calibration controller 150 receives the second digital signal $DLF_{OUT}$, and determines whether the second digital signal $DLF_{OUT}$ satisfy a requirement. In an example, the calibration controller 150 uses a counter to count up or count down in response to comparisons of the second digital signal $DLF_{OUT}$ to an upper boundary and a lower boundary of a DLF range. In an example, the counter counts up when the second digital signal $DLF_{OUT}$ is larger than the upper boundary of the DLF range, and counts down when the second digital signal $DLF_{OUT}$ is lower than the lower boundary of the DLF range. Further, the calibration controller 150 determines whether the counted number is in a range. When the counted number is in the range, the process proceeds to S299 and terminates; otherwise, the process proceeds to S250.

At S250, the controller adjusts a cap code for configuring a capacitor bank of the oscillator and adjusts a toggle code to temporally change a divisor for a frequency divider. In an example, when the first digital signal $TDC_{OUT}$ is larger than the upper boundary of the TDC range or, the second digital signal $DLF_{OUT}$ is larger than the upper boundary of the DLF range in more than half of the wait cycles (M/2), the calibration controller 150 adjusts the cap code to increase the load capacitance of the oscillator 140. In addition, the calibration controller 150 adjusts the toggle code to add a positive delay to the feedback clock signal $f_{FEEDBACK}$.

However, in the example, when the first digital signal $TDC_{OUT}$ is smaller than the lower boundary of the TDC range or the second digital signal $DLF_{OUT}$ is smaller than the lower boundary of the DLF range in more than half of the wait cycles, the calibration controller 150 adjusts the cap code to decrease the load capacitance of the oscillator 140. In addition, the calibration controller 150 adjusts the toggle code to add a negative delay to the feedback clock signal $f_{FEEDBACK}$.

At S260, the controller determines whether the search of the cap code changes direction. In an example, when the search of the cap code changes from increasing the load capacitance to decreasing the load capacitance, or when the search of cap code changes from decreasing the load capacitance to increasing the load capacitance, the process proceeds to S270; otherwise, the process returns to S220. In another example, the search of the cap code follows a sequence from the most significant bit to the least significant bit. When the search of the cap code moves to a next bit in the sequence, the process proceeds to S270; otherwise, the process returns to S220.

At S270, the number of wait cycles (M) is increased. In the FIG. 1 example, the calibration controller 150 increases the number of wait cycles (M) to allow longer time to settle the DPLL. Then, the process returns to S220.

Figure 3:
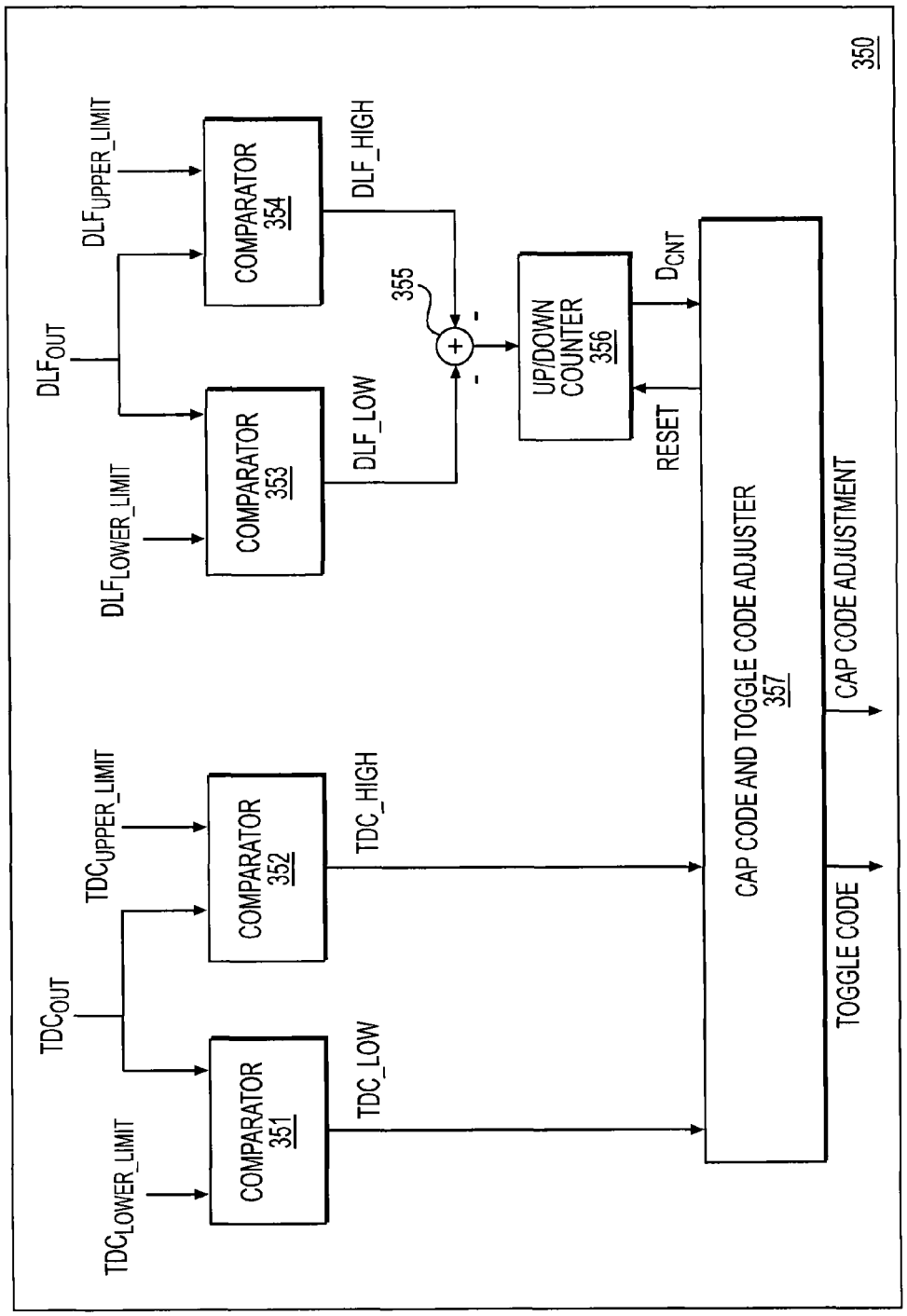
FIG. 3 shows a block diagram of a configuration controller example 350 according to an embodiment of the disclosure.

FIG. 3 shows a block diagram of a calibration controller 350 according to an embodiment of the disclosure. The calibration controller 350 can be used in the electronic system 100 in the place of the calibration controller 150. The calibration controller 350 includes a first comparator 351, a second comparator 352, a third comparator 353, a fourth comparator 354, a combiner 355, an up/down counter 356 and a cap code and toggle code adjuster 357. These elements are coupled together as shown in FIG. 3.

The first comparator 351 compares a first digital signal $TDC_{OUT}$ with a lower boundary $TDC_{LOWER\_LIMIT}$ of a TDC range, and outputs a first comparison output TDC_LOW indicative of the comparison result. For example, when the first digital signal $TDC_{OUT}$ is larger than the lower boundary $TDC_{LOWER\_LIMIT}$, the first comparison output TDC_LOW is binary zero, and when the first digital signal $TDC_{OUT}$ is smaller than the lower boundary $TDC_{LOWER\_LIMIT}$, the first comparison output TDC_LOW is binary one.

The second comparator 352 compares the first digital signal $TDC_{OUT}$ with an upper boundary $TDC_{UPPER\_LIMIT}$ of the TDC range, and outputs a second comparison output TDC_HIGH indicative of the comparison result. In an example, when the first digital signal $TDC_{OUT}$ is larger than the upper boundary $TDC_{UPPER\_LIMIT}$, the second comparison output TDC_HIGH is binary one, and when the first digital signal $TDC_{OUT}$ is smaller than the upper boundary $TDC_{UPPER\_LIMIT}$, the second comparison output TDC_HIGH is binary zero.

The third comparator 353 compares a second digital signal $DLF_{OUT}$ with a lower boundary $DLF_{LOWER\_LIMIT}$ of a DLF range, and outputs a third comparison output DLF_LOW indicative of the comparison result. For example, when the second digital signal $DLF_{OUT}$ is larger than the lower boundary $DLF_{LOWER\_LIMIT}$, the third comparison output DLF_LOW is binary zero, and when the second digital signal $DLF_{OUT}$ is smaller than the lower boundary $DLF_{LOWER\_LIMIT}$, the third comparison output DLF_LOW is binary one.

The fourth comparator 354 compares the second digital signal $DLF_{OUT}$ with an upper boundary $DLF_{UPPER\_LIMIT}$ of the DLF range, and outputs a fourth comparison output DLF_HIGH indicative of the comparison result. In an example, when the second digital signal $DLF_{OUT}$ is larger than the upper boundary $DLF_{UPPER\_LIMIT}$, the fourth comparison output DLF_HIGH is binary one, and when the second digital signal $DLF_{OUT}$ is smaller than the upper boundary $DLF_{UPPER\_LIMIT}$, the fourth comparison output DLF_HIGH is binary zero.

The third comparison result and the fourth comparison result are combined and input to the up/down counter 356. In an example, in each clock cycle of a system clock, the up/down counter 356 counts up by one when the fourth comparison result DLF_HIGH is binary one and counts down by one when the third comparison result DLF_LOW is binary one. The up/down counter 356 outputs a counter value $D_{CNT}$ to the cap code and toggle code adjuster 357.

The cap code and toggle code adjuster 357 receives the first comparison result TDC_LOW, the second comparison result TDC_HIGH and the counter value $D_{CNT}$ and generates a toggle code and a cap code adjustment based on the received information. In an embodiment, the cap code and toggle code adjuster 357 initializes M for the number of wait cycles of the system clock, then the cap code and toggle code adjuster 357 sends a reset signal to the up/down counter 356 to reset the counter value to zero. The cap code and toggle code adjuster 357 waits for M clock cycles and determines the toggle code and the cap code adjustment based on the received information.

In an example, when the second comparison result TDC_HIGH is binary one, or when the counter value $D_{CNT}$ is more than M/2, the cap code and toggle code adjuster 357 controls the cap code adjustment for a capacitor bank, such as the capacitor bank 145 and the like to increase a load capacitance. In addition, the cap code and toggle code adjuster 357 sets the toggle code, for example, to positive one to add a positive delay to the feedback clock signal $f_{FEEDBACK}$. Further, the cap code and toggle code adjuster 357 sends the reset signal to the up/down counter 356 to reset the counter value to zero, and waits for M clock cycles before next toggle code and cap code adjustment.

In the example, when the first comparison result TDC_LOW is binary one, or when the counter value $D_{CNT}$ is smaller than $-M/2$, the cap code and toggle code adjuster 357 controls the cap code adjustment to decrease the load capacitance. In addition, the cap code and toggle code adjuster 357 sets the toggle code to negative one to add a negative delay to the feedback clock signal $f_{FEEDBACK}$. Further, the cap code and toggle code adjuster 357 sends the reset signal to the up/down counter 356 to reset the counter value to zero, and waits for M clock cycles before next toggle code and cap code adjustment.

In the example, when both the first comparison result and the second comparison results are binary zero and the absolute value of the counter value $D_{CNT}$ is smaller than M/2, the cap code and toggle code adjuster 357 outputs a signal to indicate the calibration is done.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A circuit, comprising:
   a detector configured to generate a first signal indicative a timing difference between a reference clock signal and a feedback clock signal generated based on an oscillating signal from an oscillator;
   a loop filter configured to filter out a portion of frequency components from the first signal to generate a second signal for tuning a first tuning circuit of the oscillator, the oscillator including the first tuning circuit and a second tuning circuit to tune a frequency of the oscillating signal; and
   a controller configured to receive the first signal from the detector and the second signal from the loop filter, feed the received first signal to a first pair of comparators, feed the received second signal to a second pair of comparators, and tune the second tuning circuit based on outputs of the first and second pairs of comparators.

2. The circuit of claim 1, wherein the controller is configured to detect whether the first signal satisfies a requirement, and tune the second tuning circuit based on the detection.

3. The circuit of claim 2, wherein the controller is configured to compare the first signal to an upper boundary and a lower boundary of a range to detect whether the first signal is in the range, and tune the second tuning circuit based on the comparisons.

4. The circuit of claim 1, wherein the controller is configured to determine a plurality of control bits for configuring a capacitor bank of the oscillator.

5. The circuit of claim 1, wherein the detector comprises a time to digital converter configured to generate a first digital signal indicative the timing difference between the reference clock signal and the feedback clock signal.

6. The circuit of claim 4, wherein the loop filter comprises a digital loop filter configured to filter out high frequency components from a first digital signal to generate a second digital signal to tune the first tuning circuit of the oscillator.

7. The circuit of claim 1, wherein:
   a frequency divider is configured to frequency-divide the oscillating signal to generate the feedback clock signal;
   a sigma-delta modulator is configured to dither a divisor for the frequency divider; and
   the controller is configured to control the sigma-delta modulator to dither the divisor based on at least one of the first signal and the second signal.

8. The circuit of claim 1, wherein the controller is configured to adjust a settling time to allow the oscillator to settle based on the tuning of the second tuning circuit.

9. A method, comprising:
   receiving, by a controller, a first signal from a detector, the first signal indicative a timing difference between a reference clock signal and a feedback clock signal generated by the detector based on an oscillating signal from an oscillator;
   receiving, by the controller, a second signal from a filter that filters out a portion of frequency components from the first signal, the second signal being used for tuning a first tuning circuit of the oscillator;
   feeding the received first signal to a first pair of comparators and feeding the received second signal to a second pair of comparators; and
   tuning a second tuning circuit of the oscillator based on outputs of the first and second pairs of comparators.

10. The method of claim 9, wherein tuning the second tuning circuit of the oscillator based on the first signal further comprises:

detecting whether the first signal satisfies a requirement; and tuning the second tuning circuit based on the detection.

11. The method of claim 10, wherein tuning the second tuning circuit of the oscillator based on the first signal further comprises:

comparing the first signal to an upper boundary and a lower boundary of a range to detect whether the first signal is in the range; and tuning the second tuning circuit based on the comparisons.

12. The method of claim 9, wherein tuning the second tuning circuit of the oscillator based on the first signal further comprises:

determining a plurality of control bits for configuring a capacitor bank of the oscillator.

13. The method of claim 9, wherein receiving the first signal indicative the timing difference between the reference clock signal and the feedback clock signal generated based on the oscillating signal from the oscillator further comprises:

receiving a first digital signal indicative the timing difference between the feedback clock signal to the reference clock signal.

14. The method of claim 13, wherein receiving the second signal from the filter that filters out the portion of frequency components from the first signal further comprises:

receiving a second digital signal from a digital loop filter that filters out high frequency components from the first digital signal.

15. The method of claim 9, further comprising:

adjusting a divisor of a frequency divider that frequency-divides the oscillating signal to generate the feedback clock signal based on at least one of the first signal and the second signal.

16. The method of claim 9, further comprising:

adjusting a settling time that allows the oscillator to settle based on the tuning of the second tuning circuit.

17. An apparatus, comprising:

an oscillator including a first tuning circuit and a second tuning circuit to tune a frequency of an oscillating signal generated by the oscillator;

a frequency divider configured to frequency divide the oscillator signal to generate a feedback clock signal;

a detector configured to generate a first signal indicative a timing difference between a reference clock signal and the feedback clock signal;

a loop filter configured to filter out a portion of frequency components from the first signal to generate a second signal for tuning the first tuning circuit of the oscillator; and a controller configured to receive the first signal from the detector and the second signal from the loop filter, feed the received first signal to a first pair of comparators, feed the received second signal to a second pair of comparators, and tune the second tuning circuit based on outputs of the first and second pairs of comparators.

18. The apparatus of claim 17, wherein the controller is configured to determine a plurality of control bits for configuring a capacitor bank of the oscillator.

19. The apparatus of claim 17, wherein:

a sigma-delta modulator is configured to dither a divisor for the frequency divider; and the controller is configured to control the sigma-delta modulator to dither the divisor based on at least one of the first signal and the second signal.

20. The apparatus of claim 17, wherein the controller is configured to adjust a settling time to allow the oscillator to settle based on the tuning of the second tuning circuit.

* * * * *